(12) United States Patent
Lee et al.

(10) Patent No.: US 10,388,739 B2
(45) Date of Patent: Aug. 20, 2019

(54) THIN-FILM TRANSISTOR INCLUDING TWO-DIMENSIONAL SEMICONDUCTOR AND DISPLAY APPARATUS INCLUDING THE SAME

(71) Applicant: LG Display Co., Ltd., Seoul (KR)

(72) Inventors: HeeSung Lee, Incheon (KR); Seoyeon Im, Paju-si (KR); Kwon-Shik Park, Seoul (KR); SungKi Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/058,156

(22) Filed: Aug. 8, 2018

(65) Prior Publication Data

US 2019/0123149 A1    Apr. 25, 2019

(30) Foreign Application Priority Data

Oct. 24, 2017    (KR) ........................ 10-2017-0138494

(51) Int. Cl.
*H01L 29/10*         (2006.01)
*H01L 29/267*        (2006.01)
(Continued)

(52) U.S. Cl.
CPC ........ *H01L 29/267* (2013.01); *H01L 27/1225* (2013.01); *H01L 29/24* (2013.01); *H01L 29/7786* (2013.01); *H01L 29/7869* (2013.01); *H01L 29/78603* (2013.01); *H01L 29/78681* (2013.01); *G02F 1/1368* (2013.01); *G02F 1/133305* (2013.01); *H01L 27/3244* (2013.01); *H01L 51/0097* (2013.01)

(58) Field of Classification Search
None
See application file for complete search history.

(56) References Cited

U.S. PATENT DOCUMENTS 8,119,445 B2 *   2/2012   Virkar ................. H01L 51/0003
                                                    257/40
9,647,012 B1 *   5/2017   Liang .................... H01L 27/127
(Continued)

FOREIGN PATENT DOCUMENTS

KR    10-2015-0029035 A    3/2015
KR    10-2016-0038675 A    4/2016

*Primary Examiner* — Hung K Vu
(74) *Attorney, Agent, or Firm* — Polsinelli PC

(57) ABSTRACT

The present disclosure relates to a thin-film transistor including two-dimensional semiconductor and display apparatus including the same. The thin-film transistor includes a gate electrode disposed on a substrate, a semiconductor layer disposed so as to overlap at least a portion of the gate electrode in the state of being isolated from the gate electrode, a gate insulation film disposed between the gate electrode and the semiconductor layer, a source electrode connected to the semiconductor layer, and a drain electrode connected to the semiconductor layer in the state of being spaced apart from the source electrode, wherein the semiconductor layer includes a first layer including an oxide semiconductor and a second layer disposed so as to overlap the first layer in a plane view, the second layer comprising a two-dimensional semiconductor, and an energy band gap of the first layer is larger than an energy band gap of the second layer.

22 Claims, 9 Drawing Sheets

(51) Int. Cl.
   *H01L 29/786*  (2006.01)
   *H01L 29/24*   (2006.01)
   *H01L 29/778*  (2006.01)
   *H01L 27/12*   (2006.01)
   *G02F 1/1333*    (2006.01)
   *H01L 27/32*     (2006.01)
   *H01L 51/00*     (2006.01)
   *G02F 1/1368*    (2006.01)

(56) References Cited

U.S. PATENT DOCUMENTS

| | | | |
|---|---|---|---|
| 2006/0157729 A1* | 7/2006 | Ueno | H01L 29/7786 |
| | | | 257/103 |
| 2015/0097193 A1* | 4/2015 | Yap | H01L 29/775 |
| | | | 257/76 |
| 2015/0123116 A1 | 5/2015 | Goto et al. | |
| 2016/0093745 A1 | 3/2016 | Diaz et al. | |

* cited by examiner

THIN-FILM TRANSISTOR INCLUDING TWO-DIMENSIONAL SEMICONDUCTOR AND DISPLAY APPARATUS INCLUDING THE SAME

CROSS-REFERENCE TO RELATED APPLICATION

This application claims the priority of Korean Patent Application No. 10-2017-0138494 filed in the Republic of Korea on Oct. 24, 2017, which is hereby incorporated by reference in its entirety.

BACKGROUND OF THE DISCLOSURE

Field of the Disclosure

The present disclosure relates to a thin-film transistor including a two-dimensional semiconductor and a display apparatus including the thin-film transistor.

Description of the Background

In the field of electronic equipment, a transistor has been widely used as a switching device or a driving device. In particular, a thin-film transistor has been widely used as a switching device of a display apparatus, such as a liquid crystal display apparatus or an organic light-emitting display apparatus, since the thin-film transistor can be manufactured on a glass substrate or a plastic substrate.

Based on a material constituting an active layer, the thin-film transistor may be classified as an amorphous silicon thin-film transistor, in which amorphous silicon is used as the active layer, a polycrystalline silicon thin-film transistor, in which polycrystalline silicon is used as the active layer, or an oxide semiconductor thin-film transistor, in which an oxide semiconductor is used as the active layer.

The amorphous silicon thin-film transistor (a-Si TFT) has advantages in that manufacturing time is short and the manufacturing cost is low, since the amorphous silicon is deposited within a short period of time in order to form the active layer. However, the amorphous silicon thin-film transistor has disadvantages in that the amorphous silicon thin-film transistor has low mobility, whereby the current-driving ability of the amorphous silicon thin-film transistor is not good, and that the threshold voltage of the amorphous silicon thin-film transistor is changed, whereby the use of the amorphous silicon thin-film transistor in an active matrix organic light-emitting device (AMOLED) is limited.

The polycrystalline silicon thin-film transistor (poly-Si TFT) is manufactured by depositing and crystallizing amorphous silicon. Since the process of crystallizing amorphous silicon is required in order to manufacture the polycrystalline silicon thin-film transistor, the number of processes is increased, with the result that manufacturing cost is increased. In addition, since the crystallizing process is performed at a high process temperature, it is difficult to apply the polycrystalline silicon thin-film transistor to a large-sized apparatus. Furthermore, it is difficult to secure the uniformity of the polycrystalline silicon thin-film transistor due to the polycrystalline properties thereof.

For the oxide semiconductor thin-film transistor (oxide semiconductor TFT), an oxide constituting the active layer may be deposited at a relatively low temperature, the mobility of the oxide semiconductor thin-film transistor is high, and a change in the resistance of the oxide is great depending on the content of oxygen, whereby desired physical properties of the oxide semiconductor thin-film transistor are easily obtained. In addition, the oxide semiconductor thin-film transistor is advantageous in the realization of a transparent display, since the oxide semiconductor is transparent due to the properties of the oxide. In the case in which the amount of oxygen in the oxide semiconductor is insufficient due to contact between the oxide semiconductor and an insulation layer or a passivation layer, however, the reliability of the oxide semiconductor is reduced.

In recent years, the demand for a thin-film transistor that exhibits excellent current properties, is small-sized, and is flexible has increased. To this end, research has been conducted into semiconductors other than the silicon-based semiconductors or the oxide semiconductor.

The above described background can be found in Korean Patent Application Publication No. 10-2016-0038675 entitled SEMICONDUCTOR DEVICE AND CHANNEL STRUCTURE THEREOF and Korean Patent Application Publication No. 10-2015-0029035 entitled THIN-FILM TRANSISTOR.

SUMMARY

The present disclosure has been made in view of the above problems, and the present disclosure to provide a thin-film transistor that includes a two-dimensional semiconductor, is thin and may be flexible, and exhibits excellent electrical properties.

In addition, the present disclosure to provide a thin-film transistor that includes a two-dimensional semiconductor and an oxide semiconductor, exhibits excellent reliability, and prevents the deterioration of electrical properties, which occurs under manufacturing process conditions, whereby the process margin of the thin-film transistor is excellent.

Further, the present disclosure to provide a display apparatus including the thin-film transistor described above.

In accordance with an aspect of the present disclosure, the above and other objects can be accomplished by the provision of a thin-film transistor including a gate electrode disposed on a substrate, a semiconductor layer disposed so as to overlap at least a portion of the gate electrode in the state of being isolated from the gate electrode, a gate insulation film disposed between the gate electrode and the semiconductor layer, a source electrode connected to the semiconductor layer, and a drain electrode connected to the semiconductor layer in the state of being spaced apart from the source electrode, wherein the semiconductor layer includes a first layer including an oxide semiconductor and a second layer disposed so as to overlap the first layer in a plane view, the second layer including a two-dimensional semiconductor, and wherein an energy band gap of the first layer is larger than an energy band gap of the second layer.

The thin-film transistor may further include a gate insulation film disposed between the gate electrode and the semiconductor layer, wherein the gate electrode may be disposed so as to be closer to the substrate than the semiconductor layer on the basis of the gate insulation film.

The thin-film transistor may further include a gate insulation film disposed between the gate electrode and the semiconductor layer, wherein the semiconductor layer may be disposed so as to be closer to the substrate than the gate electrode on the basis of the gate insulation film.

The second layer may be disposed so as to be closer to the gate electrode than the first layer on the basis of the gate electrode.

The first layer may have an energy band gap of 3.0 eV or more.

The first layer may include gallium (Ga) and at least one metal element other than gallium, and the content of gallium may be 1.5 times or more the content of each of the at least one metal element based on the number of atoms.

The two-dimensional semiconductor may include at least one of a transition metal dichalcogenide, single-layer CdTe, GaS, GaSe, $GaS_{1-x}Se_x$, $CdI_2$, $PbI_2$, $K_2Al_4(Si_6Al_2O_{28})(OH, F)_4$, and $Mg_6(Si_8O_{28})(OH)_4$.

The transition metal dichalcogenide may include at least one of molybdenum disulfide ($MoS_2$), molybdenum diselenide ($MoSe_2$), molybdenum ditelluride ($MoTe_2$), tungsten disulfide ($WS_2$), tungsten diselenide ($WSe_2$), tungsten ditelluride ($WTe_2$), niobium disulfide ($NbS_2$), niobium diselenide ($NbSe_2$), niobium ditelluride ($NbTe_2$), tantalum disulfide ($TaS_2$), tantalum diselenide ($TaSe_2$), tantalum ditelluride ($TaTe_2$), hafnium disulfide ($HfS_2$), hafnium diselenide ($HfSe_2$), hafnium ditelluride ($HfTe_2$), titanium disulfide ($TiS_2$), titanium diselenide ($TiSe_2$), and titanium ditelluride ($TiTe_2$).

The second layer may be a channel layer.

The second layer may have an energy band gap ranging from 1.0 to 1.5 eV.

The second layer may have a structure in which a plurality of layers, each of which is composed of a two-dimensional semiconductor, is stacked.

The second layer may have a thickness ranging from 1.5 to 5 nm.

The semiconductor layer may further include a third layer disposed between the first layer and the second layer, the third layer being composed of a two-dimensional semiconductor.

An energy band gap of the third layer may be smaller than the energy band gap of the first layer and larger than the energy band gap of the second layer.

The third layer may have an energy band gap ranging from 1.6 to 2.5 eV.

The third layer may be composed of a single layer made of the two-dimensional semiconductor.

The third layer may have a thickness ranging from 0.5 to 1.4 nm.

The third layer may include any one of molybdenum disulfide ($MoS_2$) and tungsten disulfide ($WS_2$).

In accordance with another aspect of the present disclosure, there is provided a display apparatus including a substrate, a thin-film transistor disposed on the substrate, and a first electrode connected to the thin-film transistor, wherein the thin-film transistor includes a gate electrode disposed on the substrate, a semiconductor layer disposed so as to overlap at least a portion of the gate electrode in the state of being isolated from the gate electrode, a gate insulation film disposed between the gate electrode and the semiconductor layer, a source electrode connected to the semiconductor layer, and a drain electrode connected to the semiconductor layer in the state of being spaced apart from the source electrode, wherein the semiconductor layer includes a first layer including an oxide semiconductor and a second layer disposed so as to overlap the first layer in a plane view, the second layer including a two-dimensional semiconductor, and wherein an energy band gap of the first layer is larger than an energy band gap of the second layer.

BRIEF DESCRIPTION OF THE DRAWINGS

The above and features and other advantages of the present disclosure will be more clearly understood from the following detailed description taken in conjunction with the accompanying drawings, in which.

DETAILED DESCRIPTION

Figure 1:
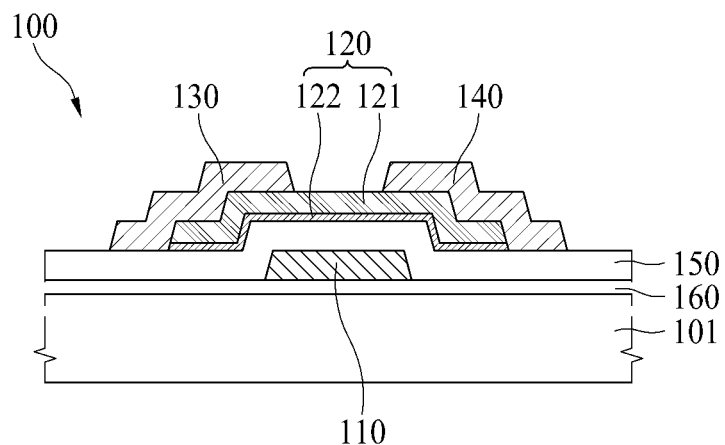
FIG. 1 is a cross-sectional view of a thin-film transistor according to an aspect of the present disclosure.

Advantages and features of the present disclosure, and implementation methods thereof will be clarified through the following aspects, described with reference to the accompanying drawings. The present disclosure may, however, be embodied in different forms and should not be construed as being limited to the aspects set forth herein. Rather, these aspects are provided so that this disclosure will be thorough and complete, and will fully convey the scope of the present disclosure to those skilled in the art. Further, the present disclosure is only defined by the scope of the claims.

The shapes, sizes, ratios, angles, and numbers disclosed in the drawings for describing aspects of the present disclosure are merely examples, and thus the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case in which "comprise", "have", and "include" described in the present specification are used, another part may also be present unless "only" is used. The terms in a singular form may include plural forms unless noted to the contrary.

In construing an element, the element is construed as including an error region although there is no explicit description thereof.

In describing a positional relationship, for example, when the positional order is described as "on", "above", "below", and "next", the case of no contact therebetween may be included, unless "just" or "direct" is used. If it is mentioned that a first element is positioned "on" a second element, it does not mean that the first element is essentially positioned above the second element in the figure. The upper part and the lower part of an object concerned may be changed depending on the orientation of the object. Consequently, the case in which a first element is positioned "on" a second element includes the case in which the first element is positioned "below" the second element as well as the case in which the first element is positioned "above" the second element in the figure or in an actual configuration. When a layer is laminated on another layer in a cross-sectional view, it is said that the two layers are overlapped each other.

In describing a temporal relationship, for example, when the temporal order is described as "after", "subsequent", "next", and "before", a case which is not continuous may be included, unless "just" or "direct" is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in a co-dependent relationship.

Hereinafter, a thin-film transistor and a display apparatus including the same according to aspects of the present disclosure will be described in detail with reference to the accompanying drawings. In the drawings, the same or similar elements are denoted by the same reference numerals even though they are depicted in different drawings.

FIG. 1 is a schematic cross-sectional view of a thin-film transistor 100 according to an aspect of the present disclosure.

The thin-film transistor 100 according to the aspect of the present disclosure includes a gate electrode 110 disposed on a substrate 101, a semiconductor layer 120 disposed so as to overlap at least a portion of the gate electrode 110 in the state of being isolated from the gate electrode 110, a gate insulation film 150 disposed between the gate electrode 110 and the semiconductor layer 120, a source electrode 130 connected to the semiconductor layer 120, and a drain electrode 140 connected to the semiconductor layer 120 in the state of being spaced apart from the source electrode 130. The semiconductor layer 120 includes a first layer 121, which includes an oxide semiconductor, and a second layer 122, which overlaps the first layer 121 in a plane view and which includes a two-dimensional semiconductor. Here, an energy band gap of the first layer 121 is larger than an energy band gap of the second layer 122.

Hereinafter, the structure of the thin-film transistor 100 will be described in detail.

Glass or plastic may be used as the substrate 101. Transparent plastic that exhibits flexibility, such as polyimide, may be used as the plastic.

In the case in which polyimide is used as the substrate 101, heat-resistant polyimide, which withstands high temperatures, may be used in consideration of the fact that a high-temperature deposition process is carried out on the substrate 101. In this case, processes, such as deposition and etching, may be carried out in the state in which polyimide substrate is disposed on a carrier substrate composed of a highly durable material, such as glass, in order to form the thin-film transistor 100.

A buffer layer 160 is disposed on the substrate 101.

The buffer layer 160 may include at least one of a silicon oxide and a silicon nitride. The buffer layer 160 exhibits a high insulation property, high moisture- and oxygen-blocking properties, and a planar property. The buffer layer 160 protects the semiconductor layer 120. The buffer layer 160 may be formed so as to have a single layer, or a plurality of layers made of different materials may be stacked to constitute the buffer layer 160. The buffer layer 160 disposed on the substrate 101 may also be referred to as a passivation layer. The buffer layer 160 may be omitted.

The gate electrode 110 is disposed on the substrate 101. The gate electrode 110 may include at least one of an aluminum-based metal, such as aluminum (Al) or an aluminum alloy, a silver-based metal, such as silver (Ag) or a silver alloy, a copper-based metal, such as copper (Cu) or a copper alloy, a molybdenum-based metal, such as molybdenum (Mo) or a molybdenum alloy, chrome (Cr), tantalum (Ta), neodymium (Nd), and titanium (Ti). The gate electrode 110 may have a multi-layer film structure including at least two conductive films that have different physical properties.

The gate insulation film 150 is disposed on the gate electrode 110. The gate insulation film 150 serves as an insulation film between the semiconductor layer 120 and the gate electrode 110.

The gate insulation film 150 may include at least one of a silicon oxide and a silicon nitride. The gate insulation film 150 may include an aluminum oxide ($Al_2O_3$) or a hafnium oxide ($HfO_x$).

The gate insulation film 150 may have a single-layer-film structure or a multi-layer-film structure. For example, any one of a silicon oxide layer, a silicon nitride layer, an aluminum oxide layer, and a hafnium oxide layer may individually form the gate insulation film 150. Alternatively, the silicon oxide layer, the silicon nitride layer, the aluminum oxide layer, and the hafnium oxide layer may be stacked to form the gate insulation film 150.

The semiconductor layer 120 is disposed on the gate insulation film 150. The semiconductor layer 120 is isolated from the gate electrode 110, and overlaps at least a portion of the gate electrode 110. The structure of the semiconductor layer 120 will be described in detail later.

The source electrode 130 is disposed so as to be connected to the semiconductor layer 120. The drain electrode 140 is connected to the semiconductor layer 120 in the state of being spaced apart from the source electrode 130. Referring to FIG. 1, the source electrode 130 and the drain electrode 140 are disposed on the gate insulation film 150, and overlap at least a portion of the semiconductor layer 120.

Each of the source electrode 130 and the drain electrode 140 may include at least one of molybdenum (Mo), aluminum (Al), chrome (Cr), gold (Au), titanium (Ti), nickel (Ni), neodymium (Nd), copper (Cu), and an alloy thereof. Each of the source electrode 130 and the drain electrode 140 may be formed so as to have a single layer made of a metal or an alloy of metals, or may be formed so as to have a plurality of layers, such as two or more layers.

The structure in which the gate electrode 110 is disposed below the semiconductor layer 120 as shown in FIG. 1 is called a bottom gate structure. Here, the semiconductor layer 120, the gate electrode 110, the source electrode 130, and the drain electrode 140 form the thin-film transistor 100.

Hereinafter, the structure of the semiconductor layer 120 will be described in detail.

A semiconductor layer 120 according to an aspect of the present disclosure includes a first layer 121, which includes an oxide semiconductor, and a second layer 122, which overlaps the first layer 121 in a plane view and which includes a two-dimensional semiconductor. In the present disclosure, "the second layer 122 overlaps the first layer 121 in a plane view" means that the second layer 122 is laminated on the first layer 121 in a cross-sectional view, or that the first layer 121 is laminated on the second layer 122 in a cross-sectional view. Sometimes, "the second layer 122 overlaps the first layer 121 in a plane view" is expressed as "the second layer 122 overlaps the first layer 121 in a cross-sectional view".

According to an aspect of the present disclosure, the second layer 122 is disposed so as to be closer to the gate electrode 110 than the first layer 121 on the basis of the gate electrode 110. Referring to FIG. 1, the gate electrode 110, the second layer 122, and the first layer 121 are sequentially disposed. That is, the first layer 121 is disposed on the second layer 122 on the basis of the figure.

The first layer 121 includes an oxide semiconductor. Specifically, the first layer 121 may be composed of an oxide semiconductor. The first layer 121 may also be referred to as an oxide semiconductor layer. The first layer 121, which includes an oxide semiconductor, serves as a support layer for supporting the second layer 122, and protects the second layer 122.

The first layer 121 includes gallium (Ga). For example, the first layer 121 may be composed of a gallium (Ga)-based oxide semiconductor. The gallium (Ga)-based oxide semiconductor exhibits high resistance to gases, such as oxygen, and high process stability. Consequently, the first layer 121, which is formed of a gallium (Ga)-based oxide semiconductor, may effectively support and protect the second layer 122. According to an aspect of the present disclosure, the first layer 121 includes only gallium (Ga) as a metal element. However, the present disclosure is not limited thereto. The first layer 121 may further include a metal(s) other than gallium (Ga). For example, the first layer 121 may further include at least one of indium (In), zinc (Zn), and tin (Sn). For example, the first layer 121 may include an InGaZnO (IGZO)-based oxide semiconductor, an InGaZnSnO (IGZTO)-based oxide semiconductor, a GaZnSnO (GZTO)-based oxide semiconductor, an InGaO (IGO)-based oxide semiconductor, an InSnZnO (ITZO)-based oxide semiconductor, or an InSnO (ITO)-based oxide semiconductor.

In the case in which the first layer 121 further includes metal elements other than gallium (Ga), the content of gallium (Ga) of the first layer 121 may be 1.5 times or more the content of each of the other metal elements based on the number of atoms. For example, in the case in which the first layer 121 includes gallium (Ga) and a first metal element, the content of gallium (Ga) is 1.5 times or more the content of the first metal element based on the number of atoms. In this case, the content of gallium (Ga) may be 60% or more the total content of the metal elements included in the first layer 121 based on the number of atoms. In addition, in the case in which the first layer 121 includes gallium (Ga), a first metal element, and a second metal element, the content of gallium (Ga) is 1.5 times or more the content of the first metal element based on the number of atoms, and is 1.5 times or more the content of the second metal element based on the number of atoms. The same is true of the case in which first layer 121 further includes three or more metal elements in addition to gallium (Ga).

According to an aspect of the present disclosure, the first layer 121 has an energy band gap of 3.0 eV or more. More specifically, the first layer 121 may have an energy band gap ranging from 3.0 to 4.0 eV.

It is not easy to form a first layer 121 having an energy band gap of less than 3.0 eV using an oxide semiconductor including a relatively large amount of gallium. In the case in which the first layer 121 has an energy band gap of less than 3.0 eV, the stability of the first layer 121 is reduced, whereby the function of the first layer 121 as the layer for supporting the second layer 122 may be deteriorated. Consequently, the first layer 121 is configured so as to have an energy band gap of 3.0 eV or more. In addition, the first layer 121 may have an energy band gap of 4.0 eV or less in consideration of convenience in manufacture and material properties. However, the present disclosure is not limited thereto. The first layer 121 may have an energy band gap of more than 4.0 eV.

According to an aspect of the present disclosure, the first layer 121 may have a thickness ranging from 10 to 50 nm. In the case in which the thickness of the first layer 121 is less than 10 nm, the stability of the first layer 121 is reduced, and the first layer 121 may not sufficiently support the second layer 122. On the other hand, in the case in which the thickness of the first layer 121 is more than 50 nm, it is difficult to thin the thin-film transistor 100.

The second layer 122 includes a two-dimensional semiconductor.

The two-dimensional semiconductor has a thickness measured in units of an atomic layer or atomic diameter, and is generally formed in a planar shape. In one layer (e.g., a layer in plane) of the two-dimensional semiconductor, atoms are connected to each other in covalent bonding, whereby the atoms have high bonding force. However, the bonding force between layers is smaller than the bonding force in each layer. The two-dimensional semiconductor may be isolated in the form of a single layer or mechanically laminated in the form of a thin film having a plurality of stacked layers.

The two-dimensional semiconductor may include at least one of a transition metal dichalcogenide, single-layer CdTe, GaS, GaSe, $GaS_{1-x}Se_x$, $CdI_2$, $PbI_2$, $K_2Al_4(Si_6Al_2O_{28})(OH,F)_4$, and $Mg_6(Si_8O_{28})(OH)_4$.

Figure 2:
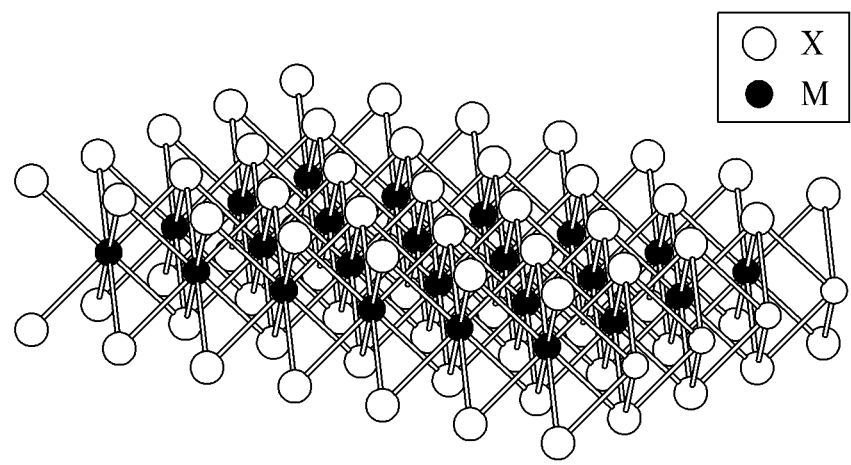
FIG. 2 is a schematic perspective view showing the structure of a two-dimensional semiconductor.

FIG. 2 is a schematic perspective view showing the structure of the two-dimensional semiconductor. Specifically, FIG. 2 illustrates a two-dimensional semiconductor expressed by the general formula $MX_2$. Here, M indicates a Group-IVB, Group-VB, or Group-VIB transition metal in the periodic table of the elements, and X indicates a chalcogen element, such as sulfur (S), selenium (Se), or tellurium (Te).

For example, there is a two-dimensional transition metal dichalcogenide (TMD) as a two-dimensional semiconductor expressed by the general formula $MX_2$. The ultra-thin layer of the two-dimensional transition metal dichalcogenide, which includes a monolayer or a plurality of stacked monolayers, exhibits an excellent transport property. Such layered materials exhibit various electrical properties. For example, the layered materials have an indirect band gap in a multi-layer bulk type structure, and have a direct band gap in a thin-layer structure.

According to an aspect of the present disclosure, a transition metal dichalcogenide may be used as the two-dimensional semiconductor. For example, the transition metal dichalcogenide may include at least one of molybdenum disulfide ($MoS_2$), molybdenum diselenide ($MoSe_2$), molybdenum ditelluride ($MoTe_2$), tungsten disulfide ($WS_2$), tungsten diselenide ($WSe_2$), tungsten ditelluride ($WTe_2$), niobium disulfide ($NbS_2$), niobium diselenide ($NbSe_2$), niobium ditelluride (NbTe$_2$), tantalum disulfide (TaS$_2$), tantalum diselenide (TaSe$_2$), tantalum ditelluride (TaTe$_2$), hafnium disulfide (HfS$_2$), hafnium diselenide (HfSe$_2$), hafnium ditelluride (HfTe$_2$), titanium disulfide (TiS$_2$), titanium diselenide (TiSe$_2$), and titanium ditelluride (TiTe$_2$).

According to an aspect of the present disclosure, the second layer 122 may include at least one of molybdenum ditelluride (MoTe$_2$), molybdenum diselenide (MoSe$_2$), tungsten diselenide (WSe$_2$), and tungsten ditelluride (WTe$_2$). In the case in which the second layer 122 is formed so as to have a structure in which two or more layers of two-dimensional semiconductor are stacked, the second layer 122 may have an energy band gap ranging from 1.0 to 1.5 eV.

According to an aspect of the present disclosure, a channel region of the thin-film transistor 100 may be formed in the second layer 122 of the semiconductor layer 120. That is, in the thin-film transistor 100 of FIG. 1, the second layer 122 is a channel layer. In the case in which the second layer 122 serves as a channel layer, when the second layer 122, which is composed of a two-dimensional semiconductor, is disposed so as to be closer to the gate electrode than the first layer 121, which is composed of an oxide semiconductor, the second layer 122 may more effectively serve as a channel layer, and may be more effectively protected by the first layer 121. However, the present disclosure is not limited thereto. The channel layer may be formed in the first layer 121.

The second layer 122 has an energy band gap ranging from 1.0 to 1.5 eV. The second layer 122 having the above-defined energy band gap may effectively serve as a channel layer. In the case in which the energy band gap of the second layer 122 is less than 1.0 eV, it may be difficult for the second layer 122 to serve as a semiconductor layer due to the high conductivity thereof. On the other hand, in the case in which the energy band gap of the second layer 122 is more than 1.5 eV, the mobility of the second layer 122 may be reduced.

The second layer 122 may have a structure in which a plurality of layers, each of which is composed of a two-dimensional semiconductor, is stacked. For example, as shown in FIG. 2, a plurality of layers, each of which is composed of a two-dimensional semiconductor having the composition of MX$_2$, (hereinafter, referred to as "two-dimensional semiconductor layers") may be stacked to form the second layer 122. The two-dimensional semiconductor layers, which constitute the second layer 122, may be coupled to each other by Van der Waals force.

More specifically, the second layer 122 may have a structure in which two to ten layers, each of which is composed of a two-dimensional semiconductor, are stacked. For example, two two-dimensional semiconductor layers may be stacked to form the second layer 122. Alternatively, three or more two-dimensional semiconductor layers may be stacked to form the second layer 122.

In the case in which a plurality of two-dimensional semiconductor layers is stacked, the energy band gap of the second layer 122 may be reduced. More specifically, a stack formed by stacking a plurality of two-dimensional semiconductor layers has an energy band gap smaller than the energy band gap of a single two-dimensional semiconductor layer. As the number of two-dimensional semiconductor layers that are stacked is increased, the energy band gap of the second layer 122 is reduced. Consequently, the second layer 122, which is a stack formed by stacking a plurality of two-dimensional semiconductor layers, may exhibit an excellent channel property.

According to an aspect of the present disclosure, the second layer 122 may have a thickness of, for example, 1.5 to 5 nm. It is not easy for the second layer 122, which is formed by stacking a plurality of two-dimensional semiconductor layers, to have a thickness of less than 1.5 nm. On the other hand, since the energy band gap of the second layer 122 is not substantially reduced any more even when the thickness of the second layer 122 is more than 5 nm, it is not necessary for the thickness of the second layer 122 to exceed 5 nm in consideration of the process of thinning a device and the cost of manufacturing the device. However, the present disclosure is not limited thereto. The thickness of the second layer 122 may exceed 5 nm.

The semiconductor layer 120 according to the aspect of the present disclosure, which includes a first layer 121, which is composed of an oxide semiconductor, and a second layer 122, which is composed of a two-dimensional semiconductor, may have excellent mobility, a small thickness, and transparency. The thin-film transistor 100 according to the aspect of the present disclosure including the semiconductor layer 120 may exhibit excellent current properties, flexibility, and transparency.

In addition, the semiconductor layer 120 according to the aspect of the present disclosure may form a short channel having a channel length of 4 μm or less. Here, the channel length may be defined as the distance between the source electrode 130 and the drain electrode 140. In the case in which the semiconductor layer 120 according to the aspect of the present disclosure is used, therefore, the area of the thin-film transistor 100 may be reduced. Consequently, the thin-film transistor 100 may be used to manufacture an ultra-high-density or ultra-high-resolution display apparatus.

Specifically, the thin-film transistor 100 according to the aspect of the present disclosure may be applied to a large-area display apparatus or a high-resolution display apparatus such that the display apparatus exhibits an excellent display property and flexibility. In addition, a substrate 101 exhibiting flexibility may be used in order to manufacture a flexible display apparatus.

According to an aspect of the present disclosure, the second layer 122, which is composed of a two-dimensional semiconductor, is supported and protected by the first layer 121, which is composed of an oxide semiconductor. As a result, damage to the second layer 122 is prevented during the manufacture of the semiconductor layer 120 or during the use of the display apparatus, whereby the second layer 122 may maintain the inherent properties of the two-dimensional semiconductor. Accordingly, compared to the case in which the semiconductor layer is formed using the two-dimensional semiconductor alone, the range in which materials for the passivation film or the insulation film are chosen may be widened and the range in which process temperatures, such as those of deposition or heat treatment, are chosen may also be widened. According to the present disclosure, therefore, process reliability and stability may be improved.

Figure 3:
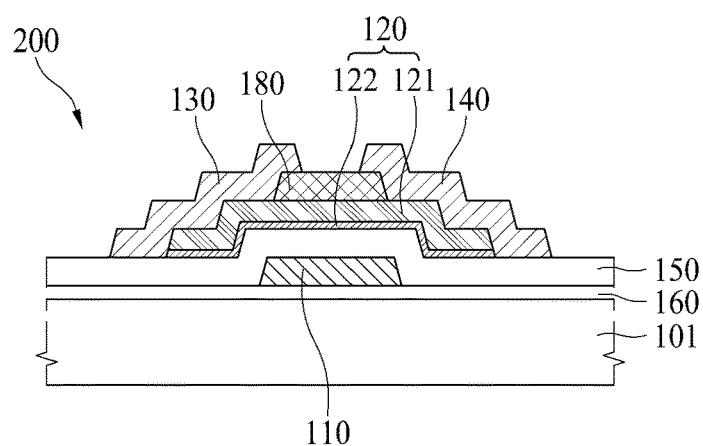
FIG. 3 is a cross-sectional view of a thin-film transistor according to another aspect of the present disclosure.

FIG. 3 is a cross-sectional view of a thin-film transistor 200 according to another aspect of the present disclosure. Hereinafter, a description of the components that have already been described above will be omitted in order to avoid duplication of description.

Compared to the thin-film transistor 100 shown in FIG. 1, the thin-film transistor 200 shown in FIG. 3 further includes an etch stopper 180 disposed on the semiconductor layer 120. The etch stopper 180 may be made of an insulation material, such as a silicon oxide. The etch stopper 180 may protect a channel region of the semiconductor layer 120. Consequently, the semiconductor layer 120 according to the aspect of the present disclosure may be applied to a thin-film transistor 200 having an etch stopper structure.

Figure 4:
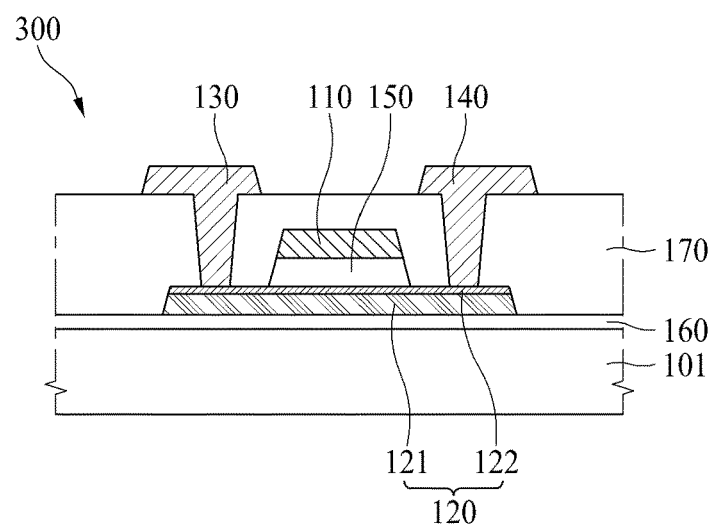
FIG. 4 is a cross-sectional view of a thin-film transistor according to another aspect of the present disclosure.

FIG. 4 is a cross-sectional view of a thin-film transistor 300 according to another aspect of the present disclosure.

The thin-film transistor 300 shown in FIG. 4 includes a buffer layer 160 disposed on a substrate 101, a semiconductor layer 120 disposed on the buffer layer 160, a gate electrode 110 disposed so as to overlap at least a portion of the semiconductor layer 120 in the state of being isolated from the semiconductor layer 120, a gate insulation film 150 disposed between the gate electrode 110 and the semiconductor layer 120, an interlayer insulation film 170 disposed on the gate electrode 110, a source electrode 130 connected to the semiconductor layer 120, and a drain electrode 140 connected to the semiconductor layer 120 in the state of being spaced apart from the source electrode 130.

Although not shown, a light-blocking layer (not shown) may be disposed between the substrate 101 and the buffer layer 160 or on the buffer layer 160. The light-blocking layer protects the semiconductor layer 120 from light.

The semiconductor layer 120 includes a first layer 121, which includes an oxide semiconductor, and a second layer 122, which overlaps the first layer 121 in a plane view and which includes a two-dimensional semiconductor. The second layer 122 is disposed so as to be closer to the gate electrode 110 than the first layer 121 on the basis of the gate electrode 110. Referring to FIG. 4, the semiconductor layer 120 has a structure in which the second layer 122 is disposed on the first layer 121. The second layer 122 is a channel layer including a channel region.

The second layer 122 of the semiconductor layer 120 may have a structure in which a plurality of layers, each of which is composed of a two-dimensional semiconductor, is stacked. For example, as shown in FIG. 2, a plurality of layers, each of which is composed of a two-dimensional semiconductor having the composition of $MX_2$, (i.e. two-dimensional semiconductor layers) may be stacked to form the second layer 122.

The gate insulation film 150 is disposed on the semiconductor layer 120, and the gate electrode 110 is disposed on the gate insulation film 150. The gate electrode 110 is isolated from the semiconductor layer 120 by the gate insulation film 150.

The interlayer insulation film 170 is disposed on the gate electrode 110. The interlayer insulation film 170 is composed of an insulation material. Specifically, the interlayer insulation film 170 may be composed of an organic material, an inorganic material, or a stack including an organic material layer and an inorganic material layer.

The source electrode 130 and the drain electrode 140 are disposed on the interlayer insulation film 170. The source electrode 130 and the drain electrode 140 are connected to the semiconductor layer 120 in the state of being spaced apart from each other. Referring to FIG. 4, the source electrode 130 and the drain electrode 140 are connected to the semiconductor layer 120 via contact holes formed through the interlayer insulation film 170.

The structure in which the gate electrode 110 is disposed above the semiconductor layer 120 as shown in FIG. 4 is called a top gate structure. The semiconductor layer 120, the gate electrode 110, the source electrode 130, and the drain electrode 140 form the thin-film transistor 300.

Figure 5:
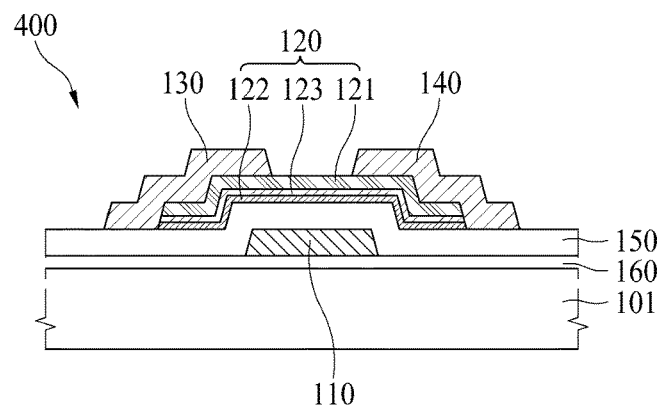
FIG. 5 is a cross-sectional view of a thin-film transistor according to another aspect of the present disclosure.

FIG. 5 is a cross-sectional view of a thin-film transistor 400 according to another aspect of the present disclosure. The thin-film transistor 400 shown in FIG. 5 further includes a third layer 123 provided in the semiconductor layer 120, compared to the thin-film transistor 100 shown in FIG. 1.

More specifically, the semiconductor layer 120 of the thin-film transistor 400 according to the aspect of the present disclosure further includes a third layer 123, which is disposed between a first layer 121 and a second layer 122 and which is composed of a two-dimensional semiconductor. Referring to FIG. 5, the semiconductor layer 120 includes a second layer 122, a third layer 123, and a first layer 121, which are sequentially stacked.

The third layer 123 serves as an intermediate layer between the first layer 121, which is composed of an oxide semiconductor, and the second layer 122, which is composed of a two-dimensional semiconductor. In addition, the third layer 123 serves to increase bonding force between the first layer 121, which is a support layer, and the second layer 122, which is a channel layer.

In the case in which the first layer 121, which is composed of an oxide semiconductor, and the second layer 122, which is composed of a two-dimensional semiconductor, directly contact each other, interaction may occur at the interface between the first layer 121 and the second layer 122. As a result, the second layer 122 may be partially damaged, atoms may move between the first layer 121 and the second layer 122, or chemical coupling may occur between the first layer 121 and the second layer 122. In this case, the two-dimensional semiconductor, which constitutes the second layer 122, may be damaged. In addition, the energy band gap of the second layer 122 may be increased, whereby the function of the second layer 122 as a channel layer may be reduced. In particular, the second layer 122 may be damaged due to the contact of the second layer 122 with the first layer 121, since the difference in energy band gap between the first layer 121 and the second layer 122 is great.

Additionally, in the case in which the first layer 121 and the second layer 122 directly contact each other, under some rigorous conditions, the first layer 121 and the second layer 122 may be delaminated from each other, whereby the reliability of the semiconductor layer 120 may be reduced.

The third layer 123 may be disposed between the first layer 121 and the second layer 122 in order to prevent direct contact between the first layer 121 and the second layer 122 and, at the same time, to enable the first layer 121 and the second layer 122 to be more stably coupled to each other.

For example, the third layer 123 contacts the first layer 121 to interact with the first layer 121. As a result, the third layer 123 and the first layer 121 may be stably coupled to each other. In addition, the third layer 123 may be stably bonded to the second layer 122, since the third layer 123 is composed of a two-dimensional semiconductor, in the same manner as the second layer 122. The third layer 123 and the second layer 122 may be bonded to each other by Van der Waals force.

Meanwhile, even in the case in which the structure of the two-dimensional semiconductor, which constitutes the third layer 123, is partially damaged due to the contact of the third layer 123 with the first layer 121, the driving properties of the semiconductor layer 120 and the thin-film transistor 400 are not deteriorated, since the second layer 122, which serves as a channel layer, is independently provided.

According to another aspect of the present disclosure, the energy band gap of the third layer 123 is designed to be smaller than the energy band gap of the first layer 121 and to be larger than the energy band gap of the second layer 122 such that the third layer 123 is disposed between the first layer 121 and the second layer 122 so as to be stably coupled to the first layer 121 and the second layer 122.

The third layer 123 may have an energy band gap of, for example, 1.6 to 2.5 eV in consideration of the energy band gap of the first layer 121 and the energy band gap of the second layer 122. As previously described, the first layer 121 has an energy band gap ranging from 3.0 to 4.0 eV, and the second layer 122 has an energy band gap ranging from 1.0 to 1.5 eV.

Figure 6:
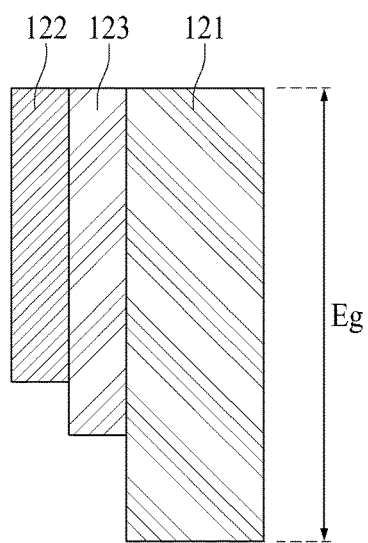
FIG. 6 is a diagram of an energy band gap.

FIG. 6 is a diagram of the energy band gap. Referring to FIG. 6, an abrupt change in the energy band gap between the first layer 121 and the second layer 122 is prevented, since the third layer 123 is disposed between the first layer 121 and the second layer 122. As a result, the first layer 121, the third layer 123, and the second layer 122 may be stably coupled to each other, and damage to the second layer 122, which is a channel layer, due to the first layer 121, which is a support layer, may be prevented, whereby the thin-film transistor 400 may exhibit excellent driving properties.

The third layer 123 is composed of a layer made of a two-dimensional semiconductor (i.e. a two-dimensional semiconductor layer). For example, the third layer 123 may be composed of a single layer made of a two-dimensional semiconductor. That is, the third layer 123 may be composed of a single two-dimensional semiconductor layer.

A single two-dimensional semiconductor layer has an energy band gap larger than the energy band gap of a stack formed by stacking a plurality of two-dimensional semiconductor layers. In the case in which the third layer 123 is composed of a single two-dimensional semiconductor layer, therefore, the third layer 123 may have an energy band gap equivalent to a value between the energy band gap of the first layer 121 and the energy band gap of the second layer 122. That is, in the case in which the third layer 123 is composed of a single two-dimensional semiconductor layer, the third layer 123 may have an energy band gap ranging from 1.6 to 2.5 eV.

The third layer 123 may have a thickness of 0.5 to 1.4 nm. It is not easy to form a two-dimensional semiconductor layer having a thickness of less than 0.5 nm. It is also not easy for a single two-dimensional semiconductor layer to have a thickness of more than 1.4 nm.

The third layer 123 may include any one of molybdenum disulfide ($MoS_2$) and tungsten disulfide ($WS_2$). A single-layer two-dimensional semiconductor layer composed of molybdenum disulfide ($MoS_2$) and a single-layer two-dimensional semiconductor layer composed of tungsten disulfide ($WS_2$) may be used as the third layer 123, since each of the above-mentioned single-layer two-dimensional semiconductor layers may have an energy band gap ranging from 1.6 to 2.5 eV.

Figure 7:
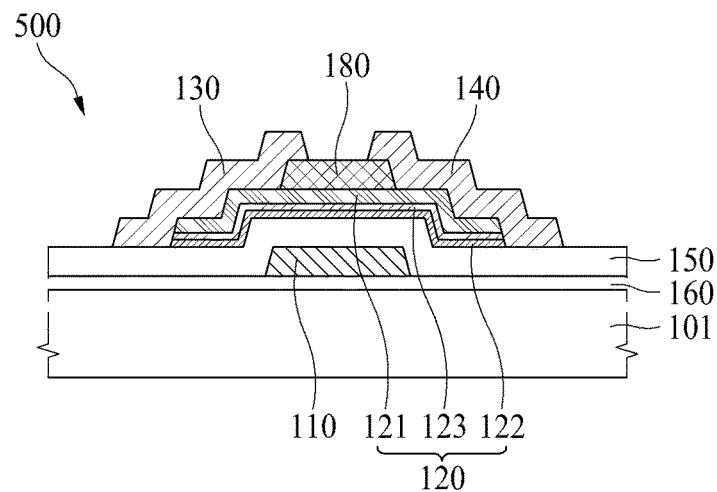
FIG. 7 is a cross-sectional view of a thin-film transistor according to another aspect of the present disclosure.

FIG. 7 is a cross-sectional view of a thin-film transistor 500 according to another aspect of the present disclosure.

Compared to the thin-film transistor 400 shown in FIG. 5, the thin-film transistor 500 shown in FIG. 7 further includes an etch stopper 180 disposed on the semiconductor layer 120. More specifically, the etch stopper 180 is disposed on the first layer 121 of the semiconductor layer 120. The etch stopper 180 may be made of an insulation material, such as a silicon oxide. The etch stopper 180 may protect a channel region of the semiconductor layer 120.

Figure 8:
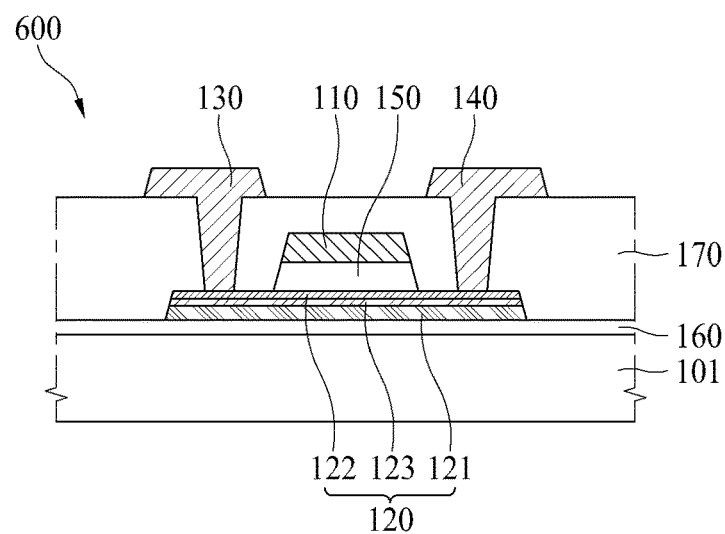
FIG. 8 is a cross-sectional view of a thin-film transistor according to another aspect of the present disclosure.

FIG. 8 is a cross-sectional view of a thin-film transistor 600 according to another aspect of the present disclosure.

The thin-film transistor 600 shown in FIG. 8 further includes a third layer 123 provided in the semiconductor layer 120, unlike the thin-film transistor 300 shown in FIG. 4. More specifically, the thin-film transistor 600 of FIG. 8 further includes a third layer 123, which is disposed between a first layer 121 and a second layer 122 of the semiconductor layer 120 and which is composed of a two-dimensional semiconductor. Referring to FIG. 8, the semiconductor layer 120 includes a first layer 121, a third layer 123, and a second layer 122, which are sequentially stacked.

The third layer 123 serves as an intermediate layer between the first layer 121, which is composed of an oxide semiconductor, and the second layer 122, which is composed of a two-dimensional semiconductor. In addition, the third layer 123 serves to increase coupling force between the first layer 121, which is a support layer, and the second layer 122, which is a channel layer.

Figure 9:
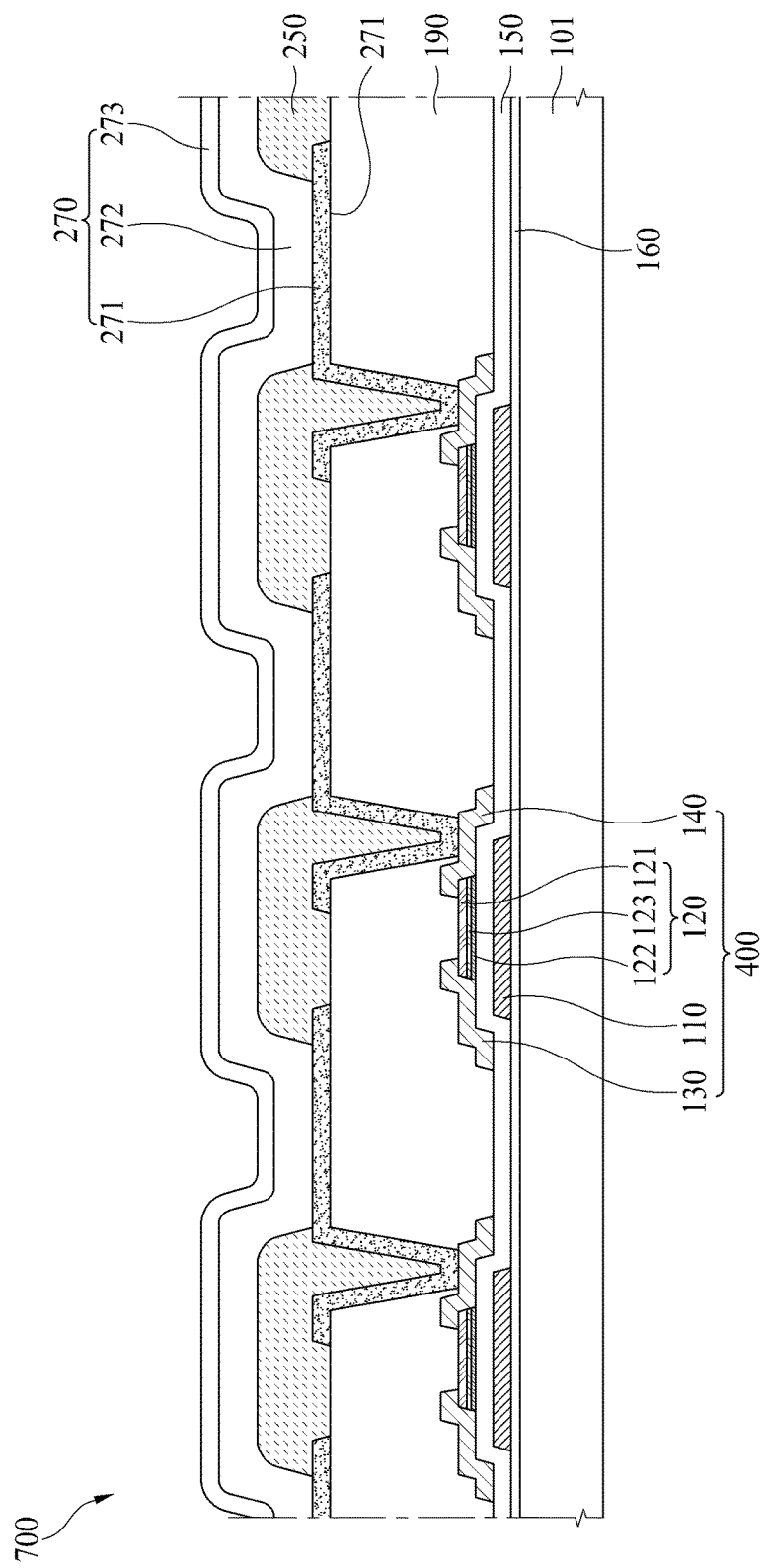
FIG. 9 is a schematic cross-sectional view of a display apparatus according to another aspect of the present disclosure.

FIG. 9 is a schematic cross-sectional view of a display apparatus 700 according to another aspect of the present disclosure.

The display apparatus 700 according to the aspect of the present disclosure includes a substrate 101, a thin-film transistor 400, and an organic light-emitting device 270 connected to the thin-film transistor 400.

Although the display apparatus 700 including the thin-film transistor 400 of FIG. 5 is shown in FIG. 9, the thin-film transistors 100, 200, 300, 500, and 600 shown in FIGS. 1, 3, 4, 7, and 8 may be applied to the display apparatus 700 of FIG. 9, in addition to the thin-film transistor 400 of FIG. 5.

Referring to FIG. 9, the display apparatus 700 according to the aspect of the present disclosure includes a substrate 101, a thin-film transistor 400 disposed on the substrate 101, and a first electrode 271 connected to the thin-film transistor 400. In addition, the display apparatus 700 includes an organic layer 272 disposed on the first electrode 271 and a second electrode 273 disposed on the organic layer 272.

Specifically, the substrate 101 may be made of glass or plastic. For a flexible display apparatus, transparent plastic that exhibits flexibility, such as polyimide, may be used as the substrate 101.

A buffer layer 160 is disposed on the substrate 101. The buffer layer 160 may be omitted.

The thin-film transistor 400 is disposed on the buffer layer 160, which is disposed on the substrate 101. The thin-film transistor 400 includes a gate electrode 110 disposed on the substrate 101, a semiconductor layer 120 disposed so as to overlap at least a portion of the gate electrode 110 in the state of being isolated from the gate electrode 110, a gate insulation film 150 disposed between the gate electrode 110 and the semiconductor layer 120, a source electrode 130 connected to the semiconductor layer 120, and a drain electrode 140 connected to the semiconductor layer 120 in the state of being spaced apart from the source electrode 130.

The semiconductor layer 120 includes a second layer 122, a third layer 123, and a first layer 121, which are sequentially stacked. The first layer 121 is an oxide semiconductor layer composed of an oxide semiconductor. The first layer 121 serves as a support. The second layer 122 includes a two-dimensional semiconductor, and serves as a channel layer. The second layer 122 may have a structure in which two to ten layers, each of which is composed of a two-dimensional semiconductor, are stacked. The third layer 123 serves as an intermediate layer between the first layer 121 and the second layer 122. The third layer 123 may be composed of a single layer made of a two-dimensional semiconductor. The energy band gap of the third layer 123 is smaller than the energy band gap of the first layer 121 and larger than the energy band gap of the second layer 122.

A passivation film 190 is disposed on the thin-film transistor 400 in order to protect the thin-film transistor 400 and to planarize the upper part of the substrate 101. The passivation film 190 may be composed of an organic insulation material that exhibits photosensitivity, such as an acrylic resin. However, the present disclosure is not limited thereto.

The first electrode 271 is disposed on the passivation film 190. The first electrode 271 is connected to the drain electrode 140 of the thin-film transistor 400 via a contact hole formed through the passivation film 190.

A bank layer 250 is disposed on the first electrode 271 and the passivation film 190 in order to define a pixel region or a light-emitting region. For example, the bank layer 250 may be disposed at the interface between pixels in a matrix fashion such that the pixel region can be defined by the bank layer 250.

The organic layer 272 is disposed on the first electrode 271. The organic layer 272 may be disposed on the bank layer 250. That is, the organic layer 272 may not be divided for each pixel, but may be continuous between adjacent pixels.

The organic layer 272 includes an organic light-emitting layer. The organic layer 272 may include a single organic light-emitting layer or two or more organic light-emitting layers that are stacked in the vertical direction. The organic layer 272 may emit any one of red, green, and blue light. Alternatively, the organic layer 272 may emit white light.

The second electrode 273 is disposed on the organic layer 272.

The first electrode 271, the organic layer 272, and the second electrode 273 are stacked to form the organic light-emitting device 270. The organic light-emitting device 270 may serve as a light quantity adjustment layer in the display apparatus 700.

Although not shown, in the case in which the organic layer 272 emits white light, each pixel may include a color filter for filtering the white light emitted from the organic layer 272 for each wavelength. The color filter is formed on a light movement path. In a so-called bottom-emission-type structure, in which light emitted from the organic layer 272 moves toward the substrate 101, which is disposed below the organic layer 272, the color filter is disposed below the organic layer 272. In a so-called top-emission-type structure, in which light emitted from the organic layer 272 moves toward the second electrode 273, which is disposed above the organic layer 272, the color filter is disposed above the organic layer 272.

Figure 10:
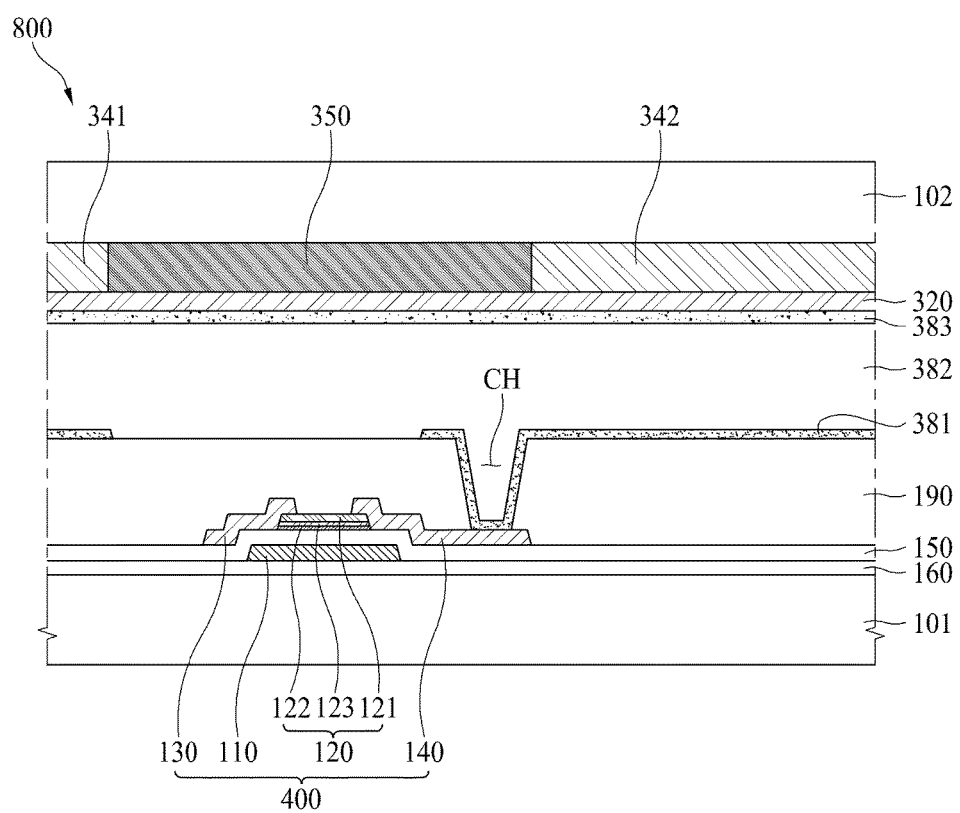
FIG. 10 is a schematic cross-sectional view of a display apparatus according to a further aspect of the present disclosure.

FIG. 10 is a schematic cross-sectional view of a display apparatus 800 according to a further aspect of the present disclosure.

Referring to FIG. 10, the display apparatus 800 according to the aspect of the present disclosure includes a substrate 101, a thin-film transistor 400 disposed on the substrate 101, and a first electrode 381 connected to the thin-film transistor 400. In addition, the display apparatus 800 includes a liquid crystal layer 382 disposed on the first electrode 381 and a second electrode 383 disposed on the liquid crystal layer 382.

The liquid crystal layer 382 serves as a light quantity adjustment layer. As described above, the display apparatus 800 shown in FIG. 10 is a liquid crystal display apparatus including a liquid crystal layer 382.

Specifically, the display apparatus 800 of FIG. 10 includes a substrate 101, a thin-film transistor 400, a passivation film 190, a first electrode 381, a liquid crystal layer 382, a second electrode 383, a barrier layer 320, color filters 341 and 342, a light-blocking unit 350, and an opposite substrate 102.

The substrate 101 may be made of glass or plastic.

The thin-film transistor 400 is disposed on the substrate 101.

Referring to FIG. 10, a buffer layer 160 is disposed on the substrate 101, a gate electrode 110 is disposed on the buffer layer 160, a gate insulation film 150 is disposed on the gate electrode 110, a semiconductor layer 120 is disposed on the gate insulation film 150, a source electrode 130 and a drain electrode 140 are disposed on the semiconductor layer 120, and the passivation film 190 is disposed on the source electrode 130 and the drain electrode 140.

FIG. 10 shows a thin-film transistor 400 having a bottom gate structure, in which the gate electrode 110 is disposed below the semiconductor layer 120. However, the present disclosure is not limited thereto. Alternatively, a thin-film transistor having a top gate structure, in which the gate electrode 110 is disposed above the semiconductor layer 120, may be used. In addition, the thin-film transistors 100, 200, 300, 500, and 600 shown in FIGS. 1, 3, 4, 7, and 8 may be applied to the display apparatus 800 of FIG. 10, in addition to the thin-film transistor 400 of FIG. 5.

The passivation film 190 is disposed on the thin-film transistor 400 in order to planarize the upper part of the substrate 101. The passivation film 190 may be composed of an organic insulation material that exhibits photosensitivity, such as an acrylic resin. However, the present disclosure is not limited thereto.

The first electrode 381 is disposed on the passivation film 190. The first electrode 381 is connected to the drain electrode 140 of the thin-film transistor 400 via a contact hole CH formed through the passivation film 190.

The opposite substrate 102 is disposed so as to be opposite the substrate 101.

The light-blocking unit 350 is disposed on the opposite substrate 102. The light-blocking unit 350 has a plurality of openings therein. The openings are disposed so as to correspond to first electrodes 381, which are pixel electrodes. The light-blocking unit 350 blocks the transmission of light through the remaining portion thereof excluding the openings. The light-blocking unit 350 is not essential, and thus may be omitted.

The color filters 341 and 342 are disposed on the opposite substrate 102, and selectively block the wavelength of light incident from a backlight unit (not shown). Specifically, the color filters 341 and 342 may be disposed in the openings defined by the light-blocking unit 350.

Each of the color filters 341 and 342 may express any one of red, green, and blue. Each of the color filters 341 and 342 may express a color other than red, green, or blue.

The barrier layer 320 may be disposed on the color filters 341 and 342 and the light-blocking unit 350. The barrier layer 320 may be omitted.

The second electrode 383 is disposed on the barrier layer 320. For example, the second electrode 383 may be disposed in front of the opposite substrate 102. The second electrode 383 may be composed of a transparent conductive material, such as ITO or IZO.

The first electrode 381 and the second electrode 383 are disposed so as to be opposite each other, and the liquid crystal layer 382 is disposed between the first electrode 381 and the second electrode 383. The second electrode 383 applies an electric field to the liquid crystal layer 382 together with the first electrode 381.

On the assumption that the surfaces of the substrate 101 and the opposite substrate 102 that face each other between the substrate 101 and the opposite substrate 102 are defined as upper surfaces of the substrate 101 and the opposite substrate 102 and the surfaces of the substrate 101 and the opposite substrate 102 that are opposite the upper surfaces thereof are defined as lower surfaces of the substrate 101 and the opposite substrate 102, a polarizing plate may be disposed on each of the lower surfaces of the substrate 101 and the opposite substrate 102.

Hereinafter, the present disclosure will be described in more detail with reference to Examples, Comparative Examples, and Experimental Examples. FIGS. 11 to 16 are views showing the results of measurement of the threshold voltage $V_{th}$ of thin-film transistors according to Comparative Examples and Examples.

Example 1

A gate electrode 110 composed of an alloy of Mo and Ti and having a thickness of 100 nm was formed on a substrate 101 made of glass, a gate insulation film 150 made of a silicon oxide was formed on the gate electrode 110, and a semiconductor layer 120 was formed on the gate insulation film 150. Specifically, a second layer 122, which is a two-dimensional semiconductor layer composed of molybdenum ditelluride ($MoTe_2$) and having a dual-layer structure, was formed on the gate electrode 110, a third layer 123, which is a two-dimensional semiconductor layer composed of molybdenum disulfide ($MoS_2$) and having a single-layer structure, was formed on the second layer 122, and a first layer 121, which is an oxide semiconductor layer including indium (In), gallium (Ga), and zinc (Zn) in a ratio of 1:1.5:1 and having a thickness of 30 nm, was formed on the third layer 123, whereby the semiconductor layer 120 was formed. Subsequently, a source electrode 130 having a thickness of 100 nm and a drain electrode 140 having a thickness of 100 nm were formed using an alloy of Mo and Ti. The thin-film transistor having the structure shown in FIG. 5 as the result of being manufactured as described above is referred to as Example 1.

Comparative Example 1

A thin-film transistor was manufactured in the same manner as in Example 1, except that a semiconductor layer composed of only a second layer 122, which is a two-dimensional semiconductor composed of molybdenum ditelluride ($MoTe_2$) and having a dual-layer structure, was formed. The thin-film transistor manufactured as described above is referred to as Comparative Example 1.

[Measurement of Threshold Voltage]

Figure 11:
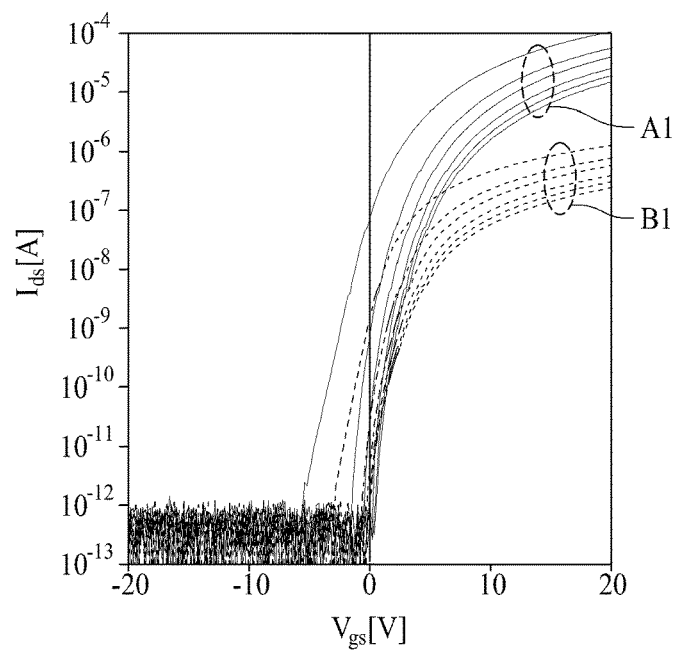
FIGS. 11 to 16 are views showing the results of measurement of the threshold voltage of thin-film transistors according to Comparative Examples and Examples.
Figure 12:
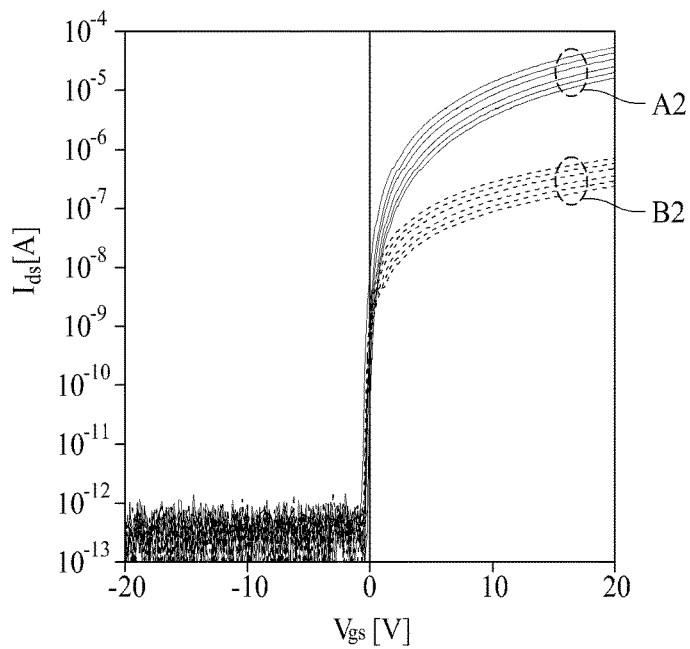

The threshold voltage $V_{th}$ of the thin-film transistors according to Example 1 and Comparative Example 1 was measured. In order to measure the threshold voltage $V_{th}$, drain current $I_{ds}$ was measured while a gate voltage $V_{gs}$ ranging from −20 V to +20 V was applied. A voltage of 10 V and a voltage of 0.1 V were applied across the source electrode 130 and the drain electrode 140. FIGS. 11 and 12 show the results of measurement of the threshold voltage $V_{th}$ of the thin-film transistors according to Comparative Example 1 and Example 1.

In FIG. 11, A1 indicates the result of measurement of the threshold voltage $V_{th}$ of the thin-film transistor according to Comparative Example 1 when a voltage of 10 V was applied across the source electrode 130 and the drain electrode 140, and B1 indicates the result of measurement of the threshold voltage $V_{th}$ of the thin-film transistor according to Comparative Example 1 when a voltage of 0.1 V was applied across the source electrode 130 and the drain electrode 140. Referring to FIG. 11, it can be seen that a change $\Delta V_{th}$ in the threshold voltage is about 2.87 V and that the slope of a graph of the drain current $I_{ds}$ in a region of the threshold voltage $V_{th}$ is not steep, whereby the driving properties of the thin-film transistor according to Comparative Example 1 are not good.

In FIG. 12, A2 indicates the result of measurement of the threshold voltage $V_{th}$ of the thin-film transistor according to Example 1 when a voltage of 10 V was applied across the source electrode 130 and the drain electrode 140, and B2 indicates the result of measurement of the threshold voltage $V_{th}$ of the thin-film transistor according to Example 1 when a voltage of 0.1 V was applied across the source electrode 130 and the drain electrode 140. Referring to FIG. 12, it can be seen that a change $\Delta V_{th}$ in the threshold voltage is 0.12 V, which is very small, and that the slope of a graph of the drain current $I_{ds}$ in a region of the threshold voltage $V_{th}$ is very steep, whereby the driving properties of the thin-film transistor according to Example 1 are excellent.

Examples 2 and 3 and Comparative Examples 2 and 3

A passivation layer made of $SiO_2$ was formed on each of the thin-film transistors manufactured according to Example 1 and Comparative Example 1. Specifically, a passivation layer made of $SiO_2$ was formed by plasma deposition using $He/N_2O/SiH_4$ gases. At this time, plasma deposition was performed under conditions in which energy ($kW/m^2$) and pressure were applied per unit area as shown in Table 1 below in order to form a passivation layer on the thin-film transistor according to Example 1 or Comparative Example 1, whereby thin-film transistors according to Examples 2 and 3 and Comparative Examples 2 and 3 were manufactured. A passivation layer made of $SiO_2$ may be used as a protective layer, a gate insulation film, or an interlayer insulation film.

TABLE 1

| | Example 2 | Example 3 | Comparative Example 2 | Comparative Example 3 |
|---|---|---|---|---|
| Thin-film transistor to be plasma-deposited | Example 1 | Example 1 | Comparative Example 1 | Comparative Example 1 |
| Applied energy ($kW/m^2$) | 0.7 | 1.0 | 0.7 | 1.0 |
| Pressure (T) | 1.5 | 1.2 | 1.5 | 1.2 |

Figure 13:
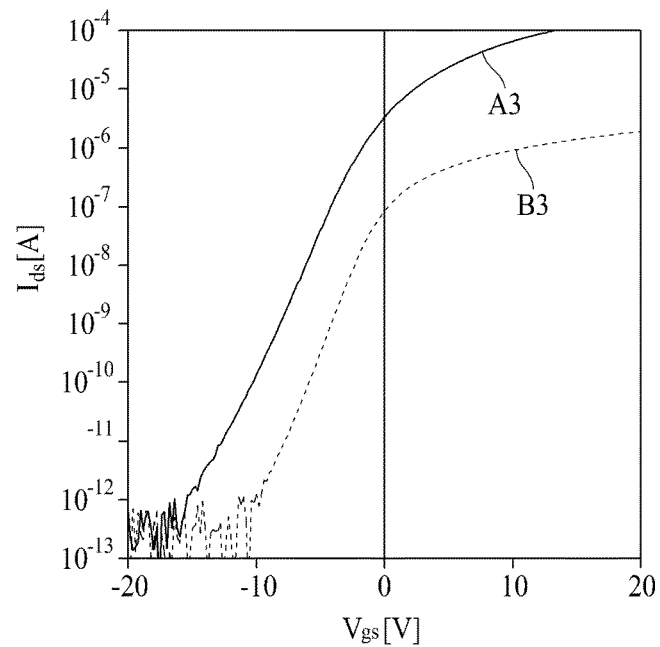
Figure 15:
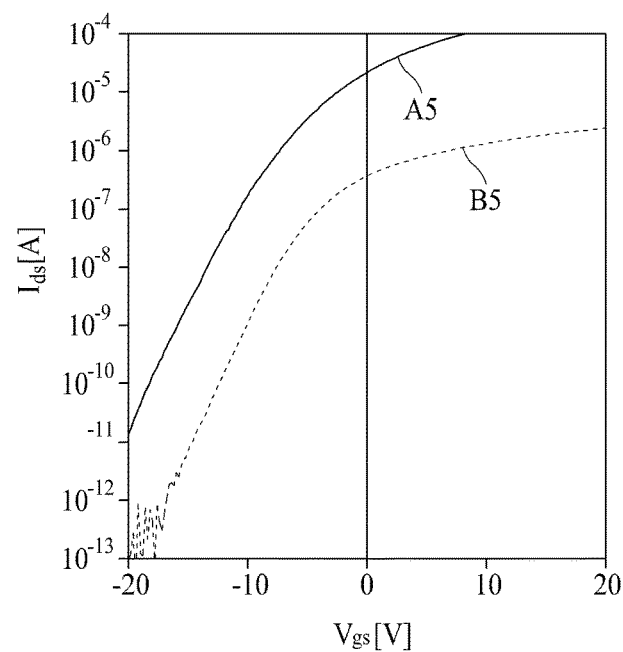
Figure 16:
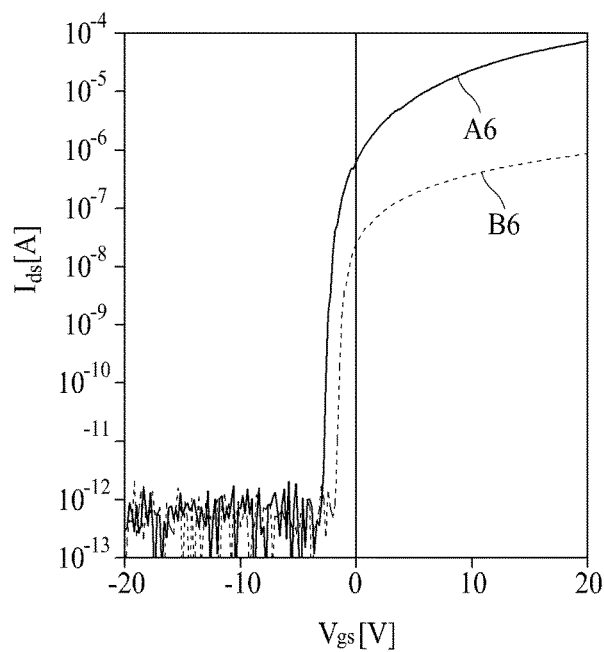

Subsequently, the threshold voltage $V_{th}$ of the thin-film transistors according to Examples 2 and 3 and Comparative Examples 2 and 3 was measured. In order to measure the threshold voltage $V_{th}$, drain current $I_{ds}$ was measured while a gate voltage $V_{gs}$ ranging from −20 V to +20 V was applied. A voltage of 10 V and a voltage of 0.1 V were applied across the source electrode 130 and the drain electrode 140. FIG. 13 shows the result of measurement of the threshold voltage $V_{th}$ of the thin-film transistor according to Comparative Example 2, FIG. 14 shows the result of measurement of the threshold voltage $V_{th}$ of the thin-film transistor according to Example 2, FIG. 15 shows the result of measurement of the threshold voltage $V_{th}$ of the thin-film transistor according to Comparative Example 3, and FIG. 16 shows the result of measurement of the threshold voltage $V_{th}$ of the thin-film transistor according to Example 3.

In FIG. 13, A3 indicates the result of measurement of the threshold voltage $V_{th}$ of the thin-film transistor according to Comparative Example 2 when a voltage of 10 V was applied across the source electrode 130 and the drain electrode 140, and B3 indicates the result of measurement of the threshold voltage $V_{th}$ of the thin-film transistor according to Comparative Example 2 when a voltage of 0.1 V was applied across the source electrode 130 and the drain electrode 140. Referring to FIG. 13, it can be seen that a change $\Delta V_{th}$ in the threshold voltage is −4.55 V, which indicates great distribution of the threshold voltage, and that the slope of a graph of the drain current $I_{ds}$ in a region of the threshold voltage $V_{th}$ is gentle, whereby the driving properties of the thin-film transistor according to Comparative Example 2 are not good.

In addition, compared to the result of measurement of the threshold voltage $V_{th}$ of the thin-film transistor according to Comparative Example 1 (see FIG. 11), it can be seen that the distribution of the threshold voltage in the thin-film transistor according to Comparative Example 2 was increased. Based on this result, it can be seen that the driving properties of the thin-film transistor were greatly reduced in the course of forming the passivation layer.

Figure 14:
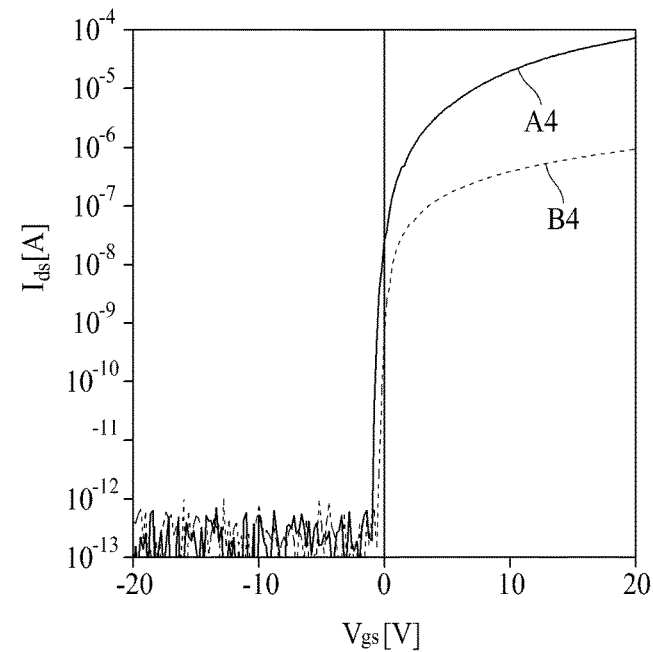

In FIG. 14, A4 indicates the result of measurement of the threshold voltage $V_{th}$ of the thin-film transistor according to Example 2 when a voltage of 10 V was applied across the source electrode 130 and the drain electrode 140, and B4 indicates the result of measurement of the threshold voltage $V_{th}$ of the thin-film transistor according to Example 2 when a voltage of 0.1 V was applied across the source electrode 130 and the drain electrode 140. Referring to FIG. 14, it can be seen that a change $\Delta V_{th}$ in the threshold voltage is 0.29 V, which is very small, and that the slope of a graph of the drain current $I_{ds}$ in a region of the threshold voltage $V_{th}$ is very steep, whereby the driving properties of the thin-film transistor according to Example 2 are excellent.

In addition, compared to the result of measurement of the threshold voltage $V_{th}$ of the thin-film transistor according to Example 1 (see FIG. 12), it can be seen that the driving properties of the thin-film transistor according to Example 2 were not greatly reduced. Based on this result, it can be seen that, in the case in which the third layer 123 is disposed on the second layer 122, which is made of a two-dimensional semiconductor, and the first layer 121, which is made of an oxide semiconductor, is formed on the third layer 123, the driving properties of the thin-film transistor according to Example 2 are not greatly reduced even when the passivation layer is formed on the semiconductor layer 120 by plasma treatment.

In FIG. 15, A5 indicates the result of measurement of the threshold voltage $V_{th}$ of the thin-film transistor according to Comparative Example 3 when a voltage of 10 V was applied across the source electrode 130 and the drain electrode 140, and B5 indicates the result of measurement of the threshold voltage $V_{th}$ of the thin-film transistor according to Comparative Example 3 when a voltage of 0.1 V was applied across the source electrode 130 and the drain electrode 140. Referring to FIG. 15, it can be seen that a change $\Delta V_{th}$ in the threshold voltage is −10.68 V, which indicates great distribution of the threshold voltage, whereby it is difficult to use the thin-film transistor according to Comparative Example 3 as a switching device.

In addition, compared to the result of measurement of the threshold voltage $V_{th}$ of the thin-film transistor according to Comparative Example 1 (see FIG. 11), the driving properties of the thin-film transistor according to Comparative Example 3 were severely deteriorated. Consequently, it can be seen that the reliability of the thin-film transistor was greatly reduced in the course of forming the passivation layer.

In FIG. 16, A6 indicates the result of measurement of the threshold voltage $V_{th}$ of the thin-film transistor according to Example 3 when a voltage of 10 V was applied across the source electrode 130 and the drain electrode 140, and B6 indicates the result of measurement of the threshold voltage $V_{th}$ of the thin-film transistor according to Example 3 when a voltage of 0.1 V was applied across the source electrode 130 and the drain electrode 140. Referring to FIG. 16, it can be seen that a change $\Delta V_{th}$ in the threshold voltage is −1.59 V, which is very small, and that the slope of a graph of the drain current $I_{ds}$ in a region of the threshold voltage $V_{th}$ is very steep, whereby the driving properties of the thin-film transistor according to Example 3 are excellent.

In addition, compared to the result of measurement of the threshold voltage $V_{th}$ of the thin-film transistor according to Example 1 (see FIG. 12), it can be seen that the driving properties of the thin-film transistor according to Example 3 were not greatly reduced. Based on this result, it can be seen that the reliability of a thin-film transistor according to an aspect of the present disclosure is not reduced even when the passivation layer is formed on the semiconductor layer 120 by plasma treatment.

As is apparent from the above description, a thin-film transistor according to an aspect of the present disclosure includes a semiconductor layer formed by stacking an oxide semiconductor and a two-dimensional semiconductor. Consequently, the thin-film transistor is thin, may be flexible, and exhibits excellent electrical properties. According to an aspect of the present disclosure, the thin-film transistor exhibits excellent reliability, since the oxide semiconductor supports the two-dimensional semiconductor. In addition, the deterioration of electrical properties due to manufacturing process conditions is prevented.

A thin-film transistor according to another aspect of the present disclosure is thin and flexible, whereby the thin-film transistor is applicable to a thin-film display apparatus and a flexible display apparatus.

In addition to the effects of the present disclosure as mentioned above, additional advantages and features of the present disclosure will be clearly understood by those skilled in the art from the above description of the present disclosure.

It will be apparent to those skilled in the art that the present disclosure described above is not limited by the above-described aspects and the accompanying drawings and that various substitutions, modifications, and variations can be made in the present disclosure without departing from the spirit or scope of the disclosure. Consequently, the scope of the present disclosure is defined by the accompanying claims, and it is intended that all variations or modifications derived from the meaning, scope, and equivalent concept of the claims fall within the scope of the present disclosure.

What is claimed is:

1. A thin-film transistor comprising:
   a gate electrode disposed on a substrate;
   a semiconductor layer disposed to overlap at least a portion of the gate electrode and isolated from the gate electrode wherein the semiconductor layer includes a first layer formed of an oxide semiconductor, and a second layer formed of a two-dimensional semiconductor disposed to overlap the first layer, and the first layer has an energy band gap larger than that of the second layer;
   a gate insulation film disposed between the gate electrode and the semiconductor layer;
   a source electrode connected to the semiconductor layer; and a drain electrode connected to the semiconductor layer and spaced apart from the source electrode.

2. The thin-film transistor according to claim 1, wherein the gate electrode is disposed to be closer to the substrate than the semiconductor layer.

3. The thin-film transistor according to claim 1, wherein the semiconductor layer is disposed to be closer to the substrate than the gate electrode.

4. The thin-film transistor according to claim 1, wherein the second layer is disposed to be closer to the gate electrode than the first layer.

5. The thin-film transistor according to claim 1, wherein the energy band gap of the first layer is 3.0 eV or higher.

6. The thin-film transistor according to claim 1, wherein the first layer includes gallium (Ga) and at least one additional metal element other than gallium, and
wherein a content of gallium is at least 1.5 times higher than a content of each of the at least one additional metal element other than gallium based on a number of atoms.

7. The thin-film transistor according to claim 1, wherein the two-dimensional semiconductor includes at least one of a transition metal dichalcogenide, a CdTe single-layer, GaS, GaSe, $GaS_{1-x}Se_x$, $CdI_2$, $PbI_2$, $K_2Al_4(Si_6Al_2O_{28})(OH,F)_4$, and $Mg_6(Si_8O_{28})(OH)_4$.

8. The thin-film transistor according to claim 7, wherein the transition metal dichalcogenide includes at least one of molybdenum disulfide ($MoS_2$), molybdenum diselenide ($MoSe_2$), molybdenum ditelluride ($MoTe_2$), tungsten disulfide ($WS_2$), tungsten diselenide ($WSe_2$), tungsten ditelluride ($WTe_2$), niobium disulfide ($NbS_2$), niobium diselenide ($NbSe_2$), niobium ditelluride ($NbTe_2$), tantalum disulfide ($TaS_2$), tantalum diselenide ($TaSe_2$), tantalum ditelluride ($TaTe_2$), hafnium disulfide ($HfS_2$), hafnium diselenide ($HfSe_2$), hafnium ditelluride ($HfTe_2$), titanium disulfide ($TiS_2$), titanium diselenide ($TiSe_2$), and titanium ditelluride ($TiTe_2$).

9. The thin-film transistor according to claim 1, wherein the second layer is a channel layer.

10. The thin-film transistor according to claim 1, wherein the second layer has an energy band gap in a range of 1.0 to 1.5 eV.

11. The thin-film transistor according to claim 1, wherein the second layer has a stacked structure in which a plurality of layers, each of which is composed of the two-dimensional semiconductor.

12. The thin-film transistor according to claim 1, wherein the second layer has a thickness in a range of 1.5 to 5 nm.

13. The thin-film transistor according to claim 1, wherein the semiconductor layer further comprises a third layer disposed between the first layer and the second layer, the third layer being composed of a two-dimensional semiconductor, wherein the two-dimensional semiconductor in the third layer is same or different from the two-dimensional semiconductor in the second layer.

14. The thin-film transistor according to claim 13, wherein the third layer has an energy band gap smaller than that of the first layer and larger than that of the second layer.

15. The thin-film transistor according to claim 13, wherein the third layer has an energy band gap in a range of 1.6 to 2.5 eV.

16. The thin-film transistor according to claim 13, wherein the third layer includes a single layer formed of the two-dimensional semiconductor.

17. The thin-film transistor according to claim 13, wherein the third layer has a thickness in a range of 0.5 to 1.4 nm.

18. The thin-film transistor according to claim 13, wherein the third layer includes molybdenum disulfide ($MoS_2$) or tungsten disulfide ($WS_2$).

19. The thin-film transistor according to claim 1, wherein the first layer has a thickness in a range of 10 to 50 nm.

20. A display apparatus comprising:
a substrate;
a thin-film transistor disposed on the substrate; and
a first electrode connected to the thin-film transistor,
wherein the thin-film transistor includes a gate electrode disposed on the substrate,
a semiconductor layer disposed to overlap at least a portion of the gate electrode and isolated from the gate electrode;
a gate insulation film disposed between the gate electrode and the semiconductor layer;
a source electrode connected to the semiconductor layer; and
a drain electrode connected to the semiconductor layer in a state of being spaced apart from the source electrode,
wherein the semiconductor layer includes,
a first layer formed of an oxide semiconductor, and
a second layer of a two-dimensional semiconductor disposed to overlap the first layer and the first layer has an energy band gap larger than that of the second layer.

21. The display apparatus according to claim 20, wherein the semiconductor layer further comprises a third layer disposed between the first layer and the second layer, wherein the third layer is composed of a two-dimensional semiconductor.

22. The display apparatus according to claim 21, wherein the display apparatus is a flexible display apparatus.

* * * * *